US 6,686,779 B2

(12) United States Patent
Yoshikawa (10) Patent No.: US 6,686,779 B2
(45) Date of Patent: Feb. 3, 2004

(54) DRIVER CIRCUIT FOR DIFFERENTIALLY OUTPUTTING DATA FROM INTERNAL CIRCUITRY OF AN LSI TO OUTSIDE THE LSI

(75) Inventor: Takefumi Yoshikawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/227,758

(22) Filed: Aug. 27, 2002

(65) Prior Publication Data

US 2003/0042940 A1 Mar. 6, 2003

(30) Foreign Application Priority Data

Aug. 31, 2001 (JP) .......................................... 2001-262969

(51) Int. Cl.[7] ................................................. H03K 3/00
(52) U.S. Cl. ....................... 327/108; 327/543; 327/562; 326/83; 330/252
(58) Field of Search ................................. 327/108–109, 327/560–563; 307/412; 326/82, 21–24; 330/252, 277, 278

(56) References Cited

U.S. PATENT DOCUMENTS 5,194,765 A * 3/1993 Dunlop et al. ................. 326/87
6,225,863 B1 * 5/2001 Miwa ............................. 330/9
6,313,670 B1 * 11/2001 Song et al. .................. 327/108
6,388,521 B1 * 5/2002 Henry .......................... 330/258
6,495,997 B2 * 12/2002 Hall et al. .................... 323/316

FOREIGN PATENT DOCUMENTS

JP  2001-292180  10/2001

OTHER PUBLICATIONS

"A 0.5–3.5Gb/s Low–Power Low–Jitter Serial Data CMOS Transceiver", Digest of Technical Papers, pp. 352–353, filed Feb. 17, 1999.

* cited by examiner

Primary Examiner—Minh Nguyen
(74) Attorney, Agent, or Firm—McDermott, Will & Emery (57) ABSTRACT

The driver circuit includes a constant current section, a first pad, a second pad, a first switching element, a second switching element, a first resistor, a second resistor, and a control section. The constant current section outputs a prescribed positive or negative current. The first switching element is connected between an output node of the constant current section and the first pad and turned ON/OFF in response to a first signal. The second switching element is connected between the output node of the constant current section and the second pad and turned ON/OFF in response to a second signal. The second signal is complementary to the first signal. The first resistor is connected between a first node receiving a first voltage and the first pad. The second resistor is connected between the first node and the second node. The control section controls a potential at the output node of the constant current section to a prescribed potential.

10 Claims, 9 Drawing Sheets

REFERENCE CURRENT
CIRCUIT

DIFFERENTIAL
DRIVER

FIG. 9

Differential
Skew

FIG. 10 and generates a desired, constant drive current. Either a differential output terminal TD or NTD to which the drive current is to be applied is determined by MOS transistors M51, M52, whereby the driver circuit digitally drives a prescribed current. This drive current is driven to a receiving device as a desired output voltage through resistors R respectively connected to the output terminals TD, NTD.

DRIVER CIRCUIT FOR DIFFERENTIALLY OUTPUTTING DATA FROM INTERNAL CIRCUITRY OF AN LSI TO OUTSIDE THE LSI

BACKGROUND OF THE INVENTION

The present invention relates to a driver circuit. More particularly, the present invention relates to a driver circuit for differentially outputting data from internal circuitry of an LSI (large scale integrated circuit) to the outside of the LSI.

Figure 8:
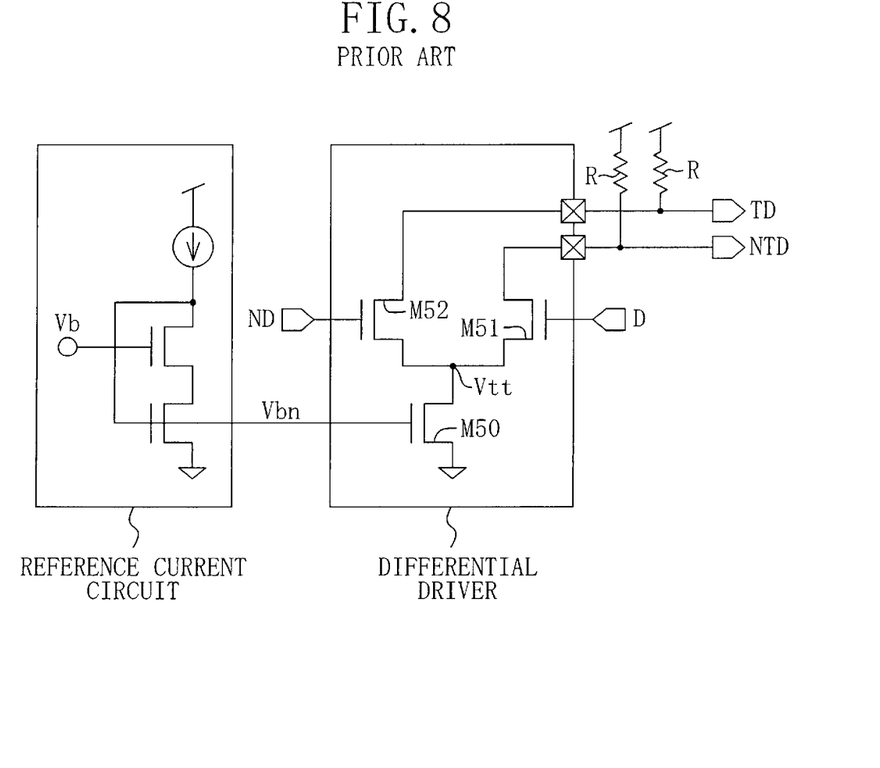
FIG. 8 is a block diagram showing the structure of a conventional driver circuit.

Recently, multimedia is rapidly becoming widespread. This raises a demand for high-speed, mass data transmission. Therefore, high-speed serial data interfaces such as IEEE1394 and Gigabit Ethernet® have attracted attention. In these interface technologies, a driver circuit differentially transmits data from internal circuitry of an LSI at a high speed such as 1 Gbit/s. As shown in FIG. 8, this driver circuit forms a current mirror by applying a bias voltage Vbn generated by a reference current circuit to the gate of a MOS (Metal Oxide Semiconductor) transistor M50, and generates a desired, constant drive current. Either a differential output terminal TD or NTD to which the drive current is to be applied is determined by MOS transistors M51, M52, whereby the driver circuit digitally drives a prescribed current. This drive current is driven to a receiving device as a desired output voltage through resistors R respectively connected to the output terminals TD, NTD.

Figure 9:
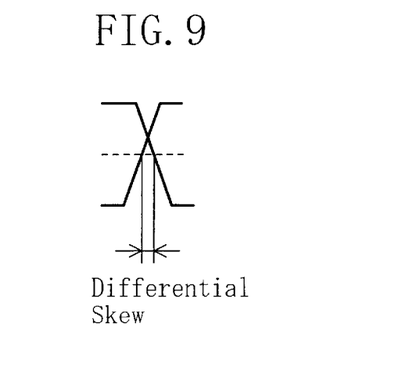
FIG. 9 illustrates a differential skew.
Figure 10:
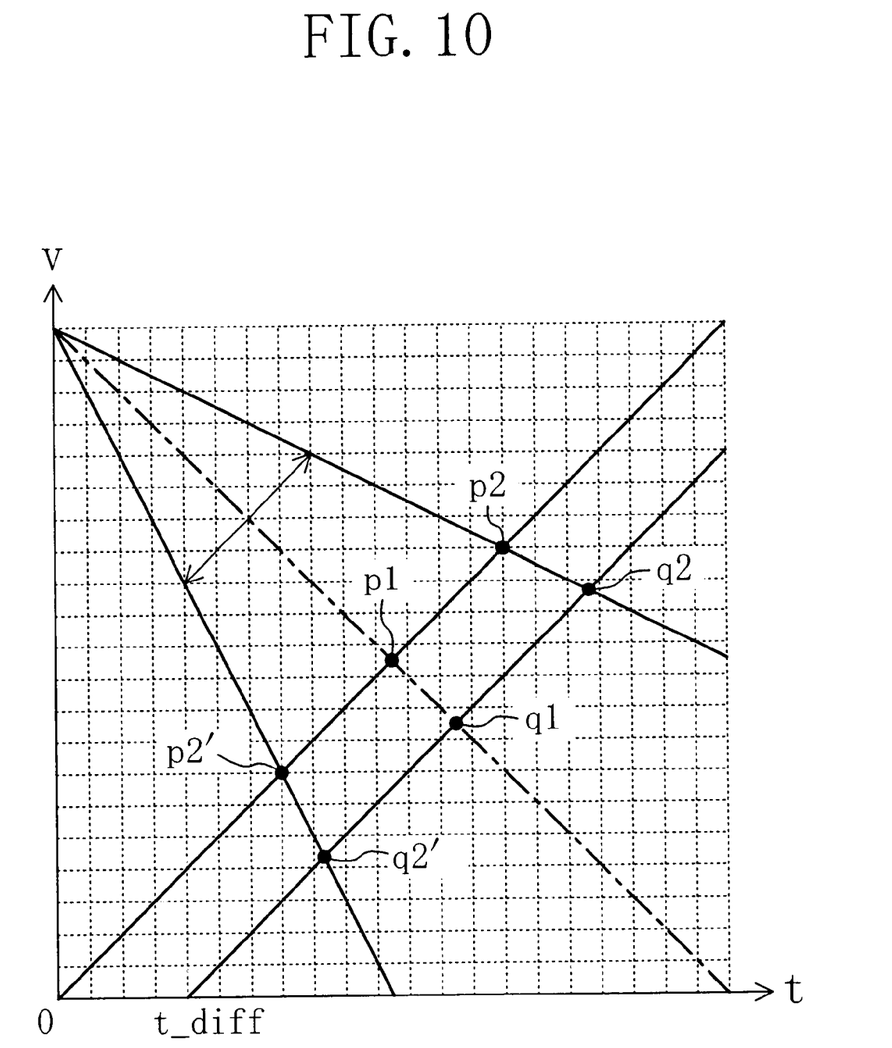
FIG. 10 illustrates a differential skew.

If the output differential data from the driver circuit of FIG. 8 do not cross at the center, a differential skew (difference between the respective medians of the differential data) is generated as shown in FIG. 9. A large differential skew would increase variation in cross point in the time direction when the drive current varies due to noises or the like. As shown in FIG. 10, provided that the differential data ideally cross at the center, the intersection p1 is shifted to p2 or p2' as the gradient of the voltage with respect to time is varied. If there is a difference in switching time, t_diff, the intersection q1 is shifted to q2 or q2' as the gradient is varied. Therefore, it can be appreciated that, provided that variation in gradient is the same, the displacement of the intersection with respect to time, i.e., (p2-p1) or (q2-q1), is increased if there is a difference in switching time. That is, (p2-p1)< (q2-q1). Accordingly, in a differential driver, variation in switching timing would increase jitter components of the time direction due to noises or the like, thereby causing reduction in margin for communications. Note that the difference in switching time, t_diff, is negative, the displacement of the intersection with respect to time is seemingly reduced. In the subsequent cycle, however, the differential potentials rise and fall in the opposite manner, whereby the difference t_diff becomes positive. In view of irregular disturbance such as noises, it is ideal to make the differential data cross at the center.

SUMMARY OF THE INVENTION

It is an object of the present invention to provide a driver circuit allowing complementary output data to cross at an appropriate position (near the center).

According to one aspect of the present invention, a driver circuit includes a constant current section, a first pad, a second pad, a first switching element, a second switching element and a control section. The constant current section outputs a prescribed positive or negative current. The first pad is capable of being connected to the other end of a first resistor having its one end connected to a first node receiving a first voltage. The second pad is capable of being connected to the other end of a second resistor having its one end connected to the first node. The first switching element is connected between an output node of the constant current section and the first pad and turned ON/OFF in response to a first signal. The second switching element is connected between the output node of the constant current section and the second pad and turned ON/OFF in response to a second signal. The second signal is complementary to the first signal. The control section controls a potential at the output node of the constant current section to a prescribed potential.

According to another aspect of the present invention, a driver circuit includes a constant current section, a first pad, a second pad, a first switching element, a second switching element, a first resistor, a second resistor and a control section. The constant current section outputs a prescribed positive or negative current. The first switching element is connected between an output node of the constant current section and the first pad and turned ON/OFF in response to a first signal. The second switching element is connected between the output node of the constant current section and the second pad and turned ON/OFF in response to a second signal. The second signal is complementary to the first signal. The first resistor is connected between a first node receiving a first voltage and the first pad. The second resistor is connected between the first node and the second pad. The control section controls a potential at the output node of the constant current section to a prescribed potential.

In the above driver circuit, the control section controls the potential at the output node of the constant current section to the prescribed potential regardless of variation in voltage and variation in process. This suppresses variation in ON/OFF timing between the first and second switching elements. This allows differential data from the first and second pads to cross at an appropriate position (near the center).

Preferably, the control section varies an on-state resistance value of the first and second switching elements according to the potential at the output node of the constant current section.

In the above driver circuit, the potential at the output node of the constant current section reduces with increase in on-state resistance value of the first and second switching elements, and increases with reduction in on-state resistance value of the first and second switching elements. The control section therefore increases the on-state resistance value of the first and second switching elements when the potential at the output node of the constant current section is higher than a desired potential, and reduces the on-state resistance value of the first and second switching elements when the potential at the output node of the constant current section is lower than the desired potential. The control section thus controls the potential at the output node of the constant current section to the prescribed potential.

Preferably, the first switching element includes a first transistor. The first transistor is connected between the output node of the constant current section and the first pad and turned ON/OFF in response to the first signal. The second switching element includes a second transistor. The second transistor is connected between the output node of the constant current section and the second pad and turned ON/OFF in response to the second signal. The control section varies a substrate potential of the first and second transistors according to the potential at the output node of the constant current section.

In the above driver circuit, if the first and second transistors are of NMOS type, the on-state resistance increases with reduction in substrate potential of the first and second transistors and reduces with increase in substrate potential. If the first and second transistors are of PMOS type, the on-state resistance varies in the manner opposite to that described above. Provided that the first and second transistors are of NMOS type, the control section reduces the substrate potential of the first and second transistors when the potential at the output node of the constant current section is higher than a desired potential. This increases the on-state resistance value of the first and second transistors and reduces the potential at the output node of the constant current section. On the other hand, when the potential at the output node of the constant current section is lower than the desired potential, the control section increases the substrate potential of the first and second transistors. This reduces the on-state resistance value of the first and second transistors and increases the potential at the output node of the constant current section. The control section thus controls the potential at the output node of the constant current section to the prescribed potential.

Preferably, the first switching element includes a first transistor and a second transistor. The first and second transistors are connected in parallel between the output node of the constant current section and the first pad and turned ON/OFF in response to the first signal. The second switching element includes a third transistor and a fourth transistor. The third and fourth transistors are connected in parallel between the output node of the constant current section and the second pad and turned ON/OFF in response to the second signal. The control section activates and inactivates the first to fourth transistors according to the potential at the output node of the constant current section.

In the above driver circuit, the first switching element has a greater on-state resistance value when either the first or second transistor is ON than when both the first and second transistors are ON. Similarly, the second switching element has a greater on-state resistance value when either the third or fourth transistor is ON than when both the third and fourth transistors are ON. Therefore, when the potential at the output node of the constant current section is higher than a desired potential, the control section activates one of the first and second transistors and inactivates the other transistor. In other words, the control section turns ON/OFF either the first or second transistor in response to the first signal. Similarly, the control section activates one of the third and fourth transistors and inactivates the other transistor. In other words, the control section turns ON/OFF either the third or fourth transistor in response to the second signal. The on-state resistance of the first and second switching elements is thus increased. On the other hand, when the potential at the output node of the constant current section is lower than the desired potential, the control section activates both the first and second transistors. In other words, the control section turns ON/OFF both the first and second transistors in response to the first signal. Similarly, the control section activates both the third and fourth transistors. In other words, the control section turns ON/OFF both the third and fourth transistors in response to the second signal. The on-state resistance of the first and second switching elements is thus reduced. In this way, the control section controls the potential at the output node of the constant current section to the prescribed potential. The above driver circuit is capable of digitally varying the on-state resistance value of the first and second switching elements. This eliminates the need to generate an analog bias potential and thus facilitates circuit design.

Preferably, the prescribed potential is set to a value close to an intermediate potential of minimum and maximum values of a gate potential of the first or second transistor minus a threshold potential of the first or second transistor.

The above driver circuit allows the transistors included in the first switching element and the transistors included in the second switching element to be accurately turned ON/OFF at the same timing.

According to still another aspect of the present invention, a driver circuit for complementarily driving first and second output nodes in response to differential input signals includes a first driving section, a second driving section and a control section. The first driving section drives the first output node in response to one of the differential input signals. The second driving section drives the second output node in response to the other differential input signal. The control section controls timing of driving the first and second driving sections so that voltage levels at the first and second output nodes switch at the same timing.

The above driver circuit suppresses variation in switching timing of the voltage level between the first and second output nodes. This allows differential data from the first and second output nodes to cross at an appropriate position (near the center).

DESCRIPTION OF THE PREFERRED EMBODIMENTS

Hereinafter, embodiments of the present invention will be described in detail with reference to the accompanying drawings. Note that the same or corresponding portions are denoted with the same reference numerals and characters throughout the figures, and description thereof will not be repeated.

(First Embodiment)

Figure 1:
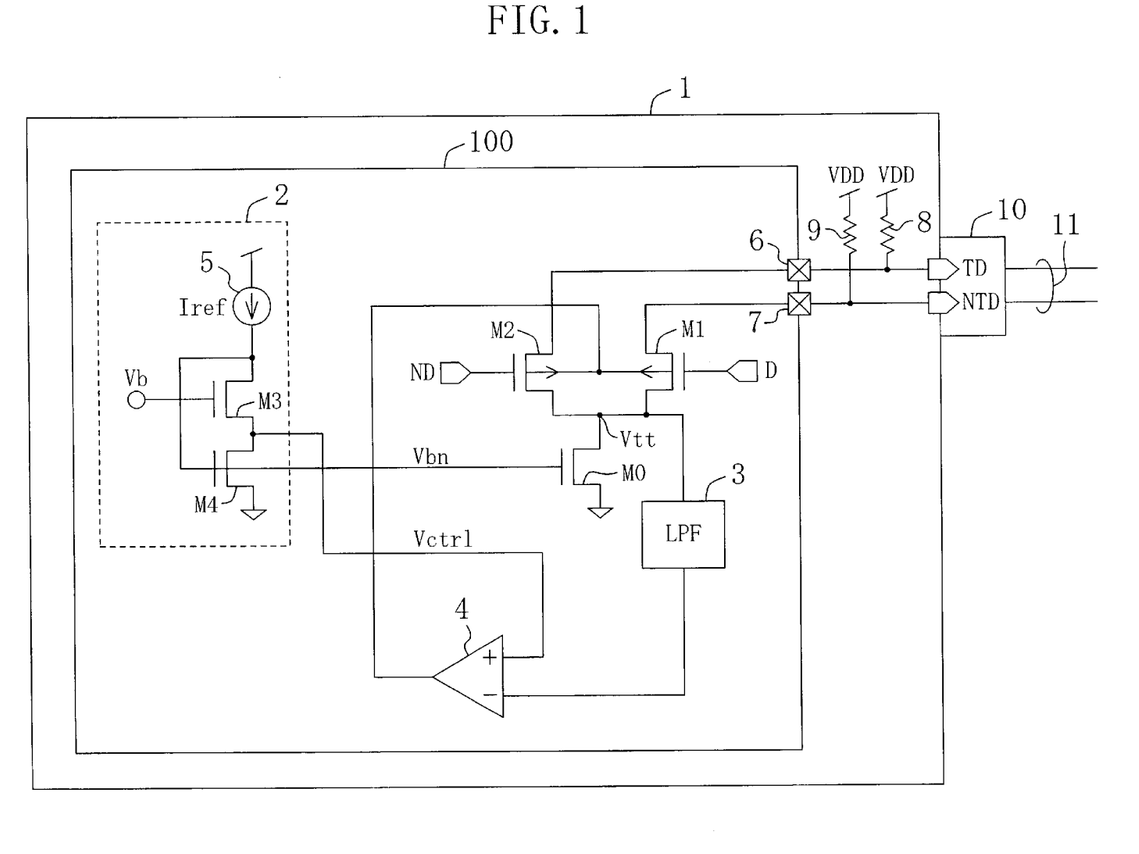
FIG. 1 is a block diagram showing the structure of an electronic equipment according to a first embodiment of the present invention.

FIG. 1 is a block diagram showing the structure of an electronic equipment according to the first embodiment of the present invention. The electronic equipment 1 of FIG. 1 outputs differential signals from output terminals TD, NTD. The differential signals output from the output terminals TD, NTD are transmitted to differential cables 11 for communications through a connector 10. The electronic equipment of FIG. 1 includes a semiconductor integrated circuit (LSI) 100, resistors 8, 9, and output terminals TD, NTD.

The LSI 100 includes a driver circuit. The driver circuit complementarily drives pads 6, 7 and output terminals TD, NTD according to differential signals (D, ND) from internal circuitry (not shown). The driver circuit includes a reference current circuit 2, N-channel MOS transistors M0 to M2, a low pass filter 3, an operational amplifier 4 and pads 6, 7.

The reference current circuit 2 includes a current source 5 and N-channel MOS transistors M3, M4. The current source 5 and the N-channel MOS transistors M3, M4 are connected in series between a power supply node receiving a power supply voltage and a ground node receiving a ground voltage.

The current source 5 outputs a prescribed current Iref. The N-channel MOS transistor M3 is connected between the current source 5 and the N-channel MOS transistor M4. A constant bias Vb is applied to the gate of the N-channel MOS transistor M3. The N-channel MOS transistor M4 is connected between the N-channel MOS transistor M3 and the ground node. A drain potential of the N-channel MOS transistor M3 is applied to the gate of the N-channel MOS transistor M4. The reference current circuit 2 applies the drain potential of the N-channel MOS transistor M3 to the gate of the N-channel MOS transistor M0 as a bias potential Vbn, and applies a drain potential of the N-channel MOS transistor M4 to a non-inverted input terminal (positive input terminal) of the operational amplifier 4 as a reference potential Vctrl. The reference potential Vctrl is set to a value close to an intermediate potential (1.25 V) of the maximum value (2.5 V) and the minimum value (0 V) of a gate potential of the N-channel MOS transistors M1, M2 minus a threshold potential (in this example, about 0.5 V) of the N-channel MOS transistors M1, M2 (the gate potential of the N-channel MOS transistors M1, M2 corresponds to the H-level and L level potentials of the signals D, ND from the internal circuitry, and it is herein assumed that the L-level potential is 0 V and the H-level potential is 2.5 V). In other words, the reference potential Vctrl is set to a value close to 0.75V.

The N-channel MOS transistor M0 is connected between the sources of the N-channel MOS transistors M1, M2 and the ground node receiving the ground voltage. The reference current circuit 2 applies the bias potential Vbn to the gate of the N-channel MOS transistor M0. The N-channel MOS transistor M0 outputs a prescribed negative constant current by a so-called current mirror. It is herein assumed that the W/L ratio of the N-channel MOS transistor M0 is k times that of the N-channel MOS transistor M4 of the reference current circuit 2 (where W is a channel width and L is a channel length). Accordingly, the N-channel MOS transistor M0 outputs a current that is k times the reference current Iref.

The N-channel MOS transistor M1 is connected between the pad 7 and the N-channel MOS transistor M0, and turned ON/OFF in response to the signal D from the internal circuitry of the LSI 100. The N-channel MOS transistor M2 is connected between the pad 6 and the N-channel MOS transistor M0, and turned ON/OFF in response to the signal ND from the internal circuitry of the LSI 100. The signal ND is complementary to the signal D.

The low pass filter 3 removes noises superimposed on a drain potential Vtt of the N-channel MOS transistor M0 and applies the resultant signal to an inverted input terminal (negative input terminal) of the operational amplifier 4. This allows for fluctuation of the drain potential Vtt of the N-channel MOS transistor M0 which may be caused by switching of the N-channel MOS transistors M1, M2.

The operational amplifier 4 receives the reference potential Vctrl from the reference current circuit 2 at its non-inverted input terminal (positive input terminal), and receives the drain potential Vtt of the N-channel MOS transistor M0 at its inverted input terminal (negative input terminal). The operational amplifier 4 applies a potential according to the comparison result of the received potentials as a substrate potential of the N-channel MOS transistors M1, M2.

The pads 6, 7 are connected to the output terminals TD, NTD, respectively.

The resistors 8, 9 are connected between a power supply node receiving a power supply voltage VDD (in this example, 3.3 V) and the output terminals TD, NTD, respectively. Each of the resistors 8, 9 has a resistance value Rterm.

Hereinafter, operation of the above electronic equipment 1 will be described.

Either the N-channel MOS transistor M1 or M2 is turned ON according to the complementary differential signals (D, ND) from the internal circuitry (not shown) of the LSI 100. A prescribed current from the N-channel MOS transistor M0 is applied to either the resistor 8 or 9 according to the signals (D, ND), and logic data (differential data) according to the signals (D, ND) are output to the output terminals (TD, NTD). The amplitude of the differential data from the output terminals (TD, NTD) is equal to the prescribed current (k×Iref) from the N-channel MOS transistor M0 multiplied by the resistance value Rterm of the resistors 8, 9.

In the conventional circuit structure of FIG. 8, a source potential Vtt of the MOS transistors M51, M52 is dependent on the transconductance (channel conductance) of the MOS transistors M51, M52. In other words, the source potential Vtt is reduced as the ambient temperature moves to a higher temperature and the process fluctuates toward the worst. On the other hand, the source potential Vtt is increased as the ambient temperature moves to a lower temperature and the process fluctuates toward the best. Increase in source potential Vtt retards the timing the MOS transistors M51, M52 are turned ON and advances the timing the transistors MOS transistors M51, M52 are turned OFF. This results in a differential skew (difference between the respective medians of differential data) as shown in FIG. 9.

In the driver circuit of FIG. 1, however, the operational amplifier 4 controls the drain potential Vtt of the N-channel MOS transistor M0 to a desired potential (in this example, the reference potential Vctrl) as described below. If the drain potential Vtt of the N-channel MOS transistor M0 is lower than the reference potential Vctrl, the output of the operational amplifier 4 is increased and thus the substrate potential of the N-channel MOS transistors M1, M2 is increased. Accordingly, the N-channel MOS transistors M1, M2 have a reduced on-state resistance. This reduces a voltage drop at the N-channel MOS transistors M1, M2 and increases the drain potential Vtt of the N-channel MOS transistor M0. On the other hand, if the drain potential Vtt of the N-channel MOS transistor M0 is higher than the reference potential Vctrl, the output of the operational amplifier 4 is reduced and thus the substrate potential of the N-channel MOS transistors M1, M2 is reduced. Accordingly, the N-channel MOS transistors M1, M2 have an increased on-state resistance. This increases a voltage drop at the N-channel MOS transistors M1, M2 and reduces the drain potential Vtt of the N-channel MOS transistor M0. This feedback effect makes the drain potential Vtt of the N-channel MOS transistor M0 equal to the drain potential Vctrl of the N-channel MOS transistor M4 in the reference current circuit 2.

As described above, the reference potential Vctrl is set to a value close to an intermediate potential (1.25 V) of the maximum value (2.5 V) and the minimum value (0 V) of the gate potential of the N-channel MOS transistors M1, M2 minus the threshold potential (about 0.5 V) of the N-channel MOS transistors M1, M2. In other words, the reference potential Vctrl is set to a value close to 0.75V. Therefore, the N-channel MOS transistors M1, M2 are switched at 1.25 V, that is, at the median of the amplitude of the differential signals (D, ND) from the internal circuitry. Accordingly, the N-channel MOS transistors M1, M2 which are switched in a complementary manner are turned ON/OFF at approximately the same timing. As a result, the differential data from the output terminals TD, NTD cross near the center (near the intersection P1 in FIG. 10), whereby a differential skew is suppressed.

As described above, the drain potential Vctrl of the N-channel MOS transistor M4 of the reference current circuit 2 becomes equal to the drain potential Vtt of the N-channel MOS transistor M0 due to the feedback effect. This means that a gate-source voltage Vgs and a drain-source voltage Vds of the N-channel MOS transistor M4 are equal to a gate-source voltage Vgs and a drain-source voltage Vds of the N-channel MOS transistor M0, respectively. This allows a current that is k times the reference current Iref to be accurately mirrored to the N-channel MOS transistor M0, whereby the output current and thus the output differential amplitude (Iref×k×Rterm) is improved in accuracy.

Figure 2:
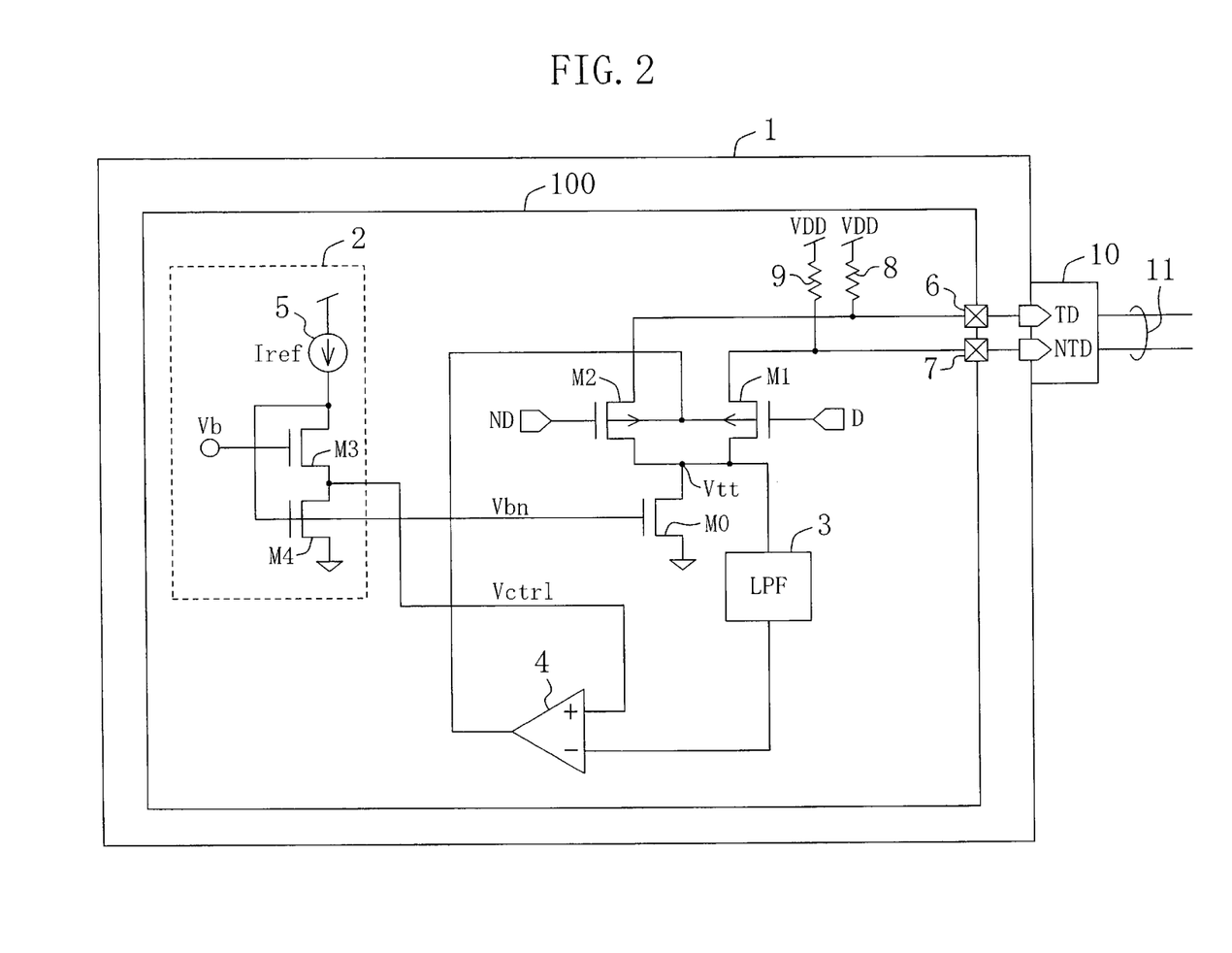
FIGS. 2 and 3 show modifications of a driver circuit in FIG. 1.

Note that the resistors 8, 9 are herein provided outside the LSI 100. As shown in FIG. 2, however, the resistors 8, 9 may alternatively be provided within the LSI 100.

Figure 3:
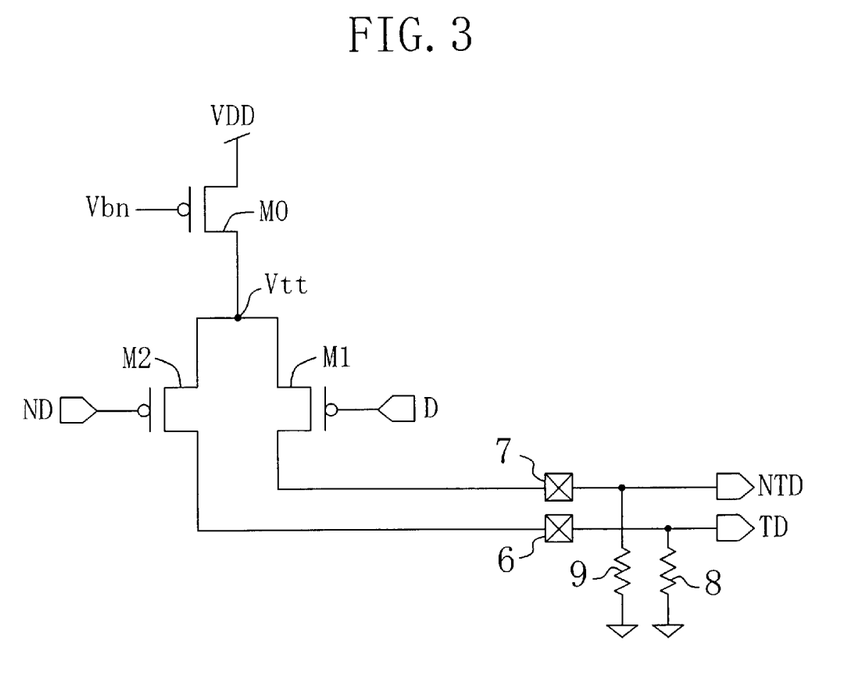

The transistor M0 as a constant current section and the transistors M1, M2 as first and second switching elements are herein N-channel MOS transistors, and the resistors 8, 9 are provided between the power supply node and the output terminals TD, NTD, respectively. As shown in FIG. 3, however, the transistor M0 as a constant current section and the transistors M1, M2 as first and second switching elements may alternatively be P-channel MOS transistors and the resistors 8, 9 may alternatively be provided between the ground node and the output terminals TD, NTD, respectively. In this case, the P-channel MOS transistor M0 outputs a constant positive current.

(Second Embodiment)

Figure 4:
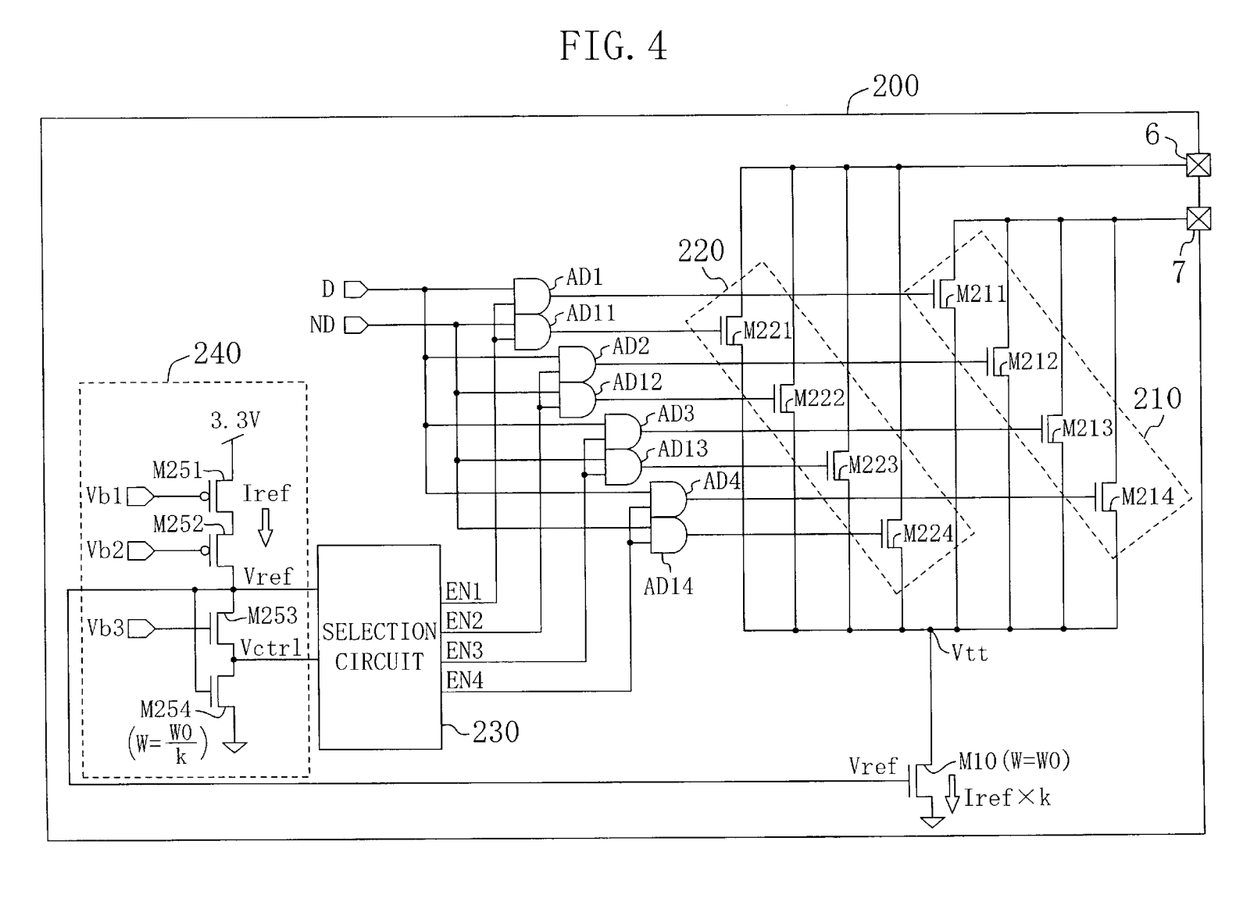
FIG. 4 is a block diagram showing the structure of an LSI in an electronic equipment according to a second embodiment of the present invention.

An electronic equipment according to the second embodiment of the present invention includes an LSI 200 of FIG. 4 instead of the LSI 100 of FIG. 1. The structure of the electronic equipment of the second embodiment is otherwise the same as that of the electronic equipment 1 of FIG. 1.

The LSI 200 of FIG. 4 includes a driver circuit. The driver circuit complementarily drives the pads 6, 7 and the output terminals TD, NTD (FIG. 1) according to differential signals (D, ND) from internal circuitry (not shown). The driver circuit includes switching elements 210, 220, a selection circuit 230, a reference current circuit 240, AND circuits AD1 to AD4, AD11 to AD14, and pads 6, 7.

The reference current circuit 240 includes N-channel MOS transistors M251 to M254. The N-channel MOS transistors M251 to M254 are connected in series between a power supply node receiving a power supply voltage (in this example, 3.3 V) and a ground node receiving a ground voltage. The N-channel MOS transistors M251, M252 receive constant biases Vb1, Vb2 at their gates, respectively, and function as a current source for outputting a prescribed current Iref. The N-channel MOS transistor M253 is connected between the N-channel MOS transistors M252 and M254 and receives a constant bias Vb3 at its gate. The N-channel MOS transistor M254 is connected between the N-channel MOS transistor M253 and the ground node and receives a drain potential Vref of the N-channel MOS transistor M253 at its gate. The N-channel MOS transistor M254 has a gate width (W=W0/k) that is 1/k times the gate width (W=W0) of an N-channel MOS transistor M10 (the N-channel MOS transistors M254, M10 have the same channel length). The reference current circuit 240 applies a drain potential of the N-channel MOS transistor M253 to the gate of the N-channel MOS transistor M10 and the selection circuit 230 as a bias potential Vref, and applies a drain potential of the N-channel MOS transistor M254 to the selection circuit 230 as a reference potential Vctrl. The reference potential Vctrl is set to a value close to an intermediate potential (1.25 V) of the maximum value (2.5 V) and the minimum value (0 V) of a gate potential of N-channel MOS transistors M211 to M214, M221 to M224 minus a threshold potential (in this example, about 0.5 V) of the N-channel MOS transistors M211 to M214, M221 to M224 (the gate potential of the N-channel MOS transistors M211 to M214, M221 to M224 corresponds to the H-level and L level potentials of the signals D, ND from the internal circuitry, and it is herein assumed that the L-level potential is 0 V and the H-level potential is 2.5 V). In other words, the reference potential Vctrl is set to a value close to 0.75V.

The selection circuit 230 receives the bias potential Vref and the reference potential Vctrl from the reference current circuit 240 and outputs enable signals EN1 to EN4.

The AND circuits AD1 to AD4 output the AND operation result of the signal D from the internal circuitry (not shown) and the enable signals EN1 to EN4 from the selection circuit 230 to the gates of the N-channel MOS transistors M211 to M214, respectively. The AND circuits AD11 to AD14 output the AND operation result of the signal ND from the internal circuitry (not shown) and the enable signals EN1 to EN4 from the selection circuit 230 to the gates of the N-channel MOS transistors M221 to M224, respectively. The signal ND is complementary to the signal D. When the enable signals EN1 to EN4 are active (logical high level), the AND circuits AD1 to AD4, AD11 to AD14 apply the signals D, ND to the gates of the N-channel MOS transistors M211 to M214, M221 to M224, respectively. In other words, the N-channel MOS transistors M211 to M214, M221 to M224 are activated. On the other hand, when the enable signals EN1 to EN4 are inactive (logical low level), the AND circuits AD1 to AD4, AD11 to AD14 apply an inactive (logical low level) signal to the gates of the N-channel MOS transistors M211 to M214, M221 to M224, respectively, regardless of the signals D, ND. In other words, the N-channel MOS transistors M211 to M214, M221 to M224 are inactivated. Note that the logical high level of the differential signals (D, ND) from the internal circuitry and the level of the power supply voltage of the AND circuits AD1 to AD4, AD11 to AD14 are herein 2.5 V.

The switching element 210 includes N-channel MOS transistors M211 to M214. The N-channel MOS transistors M211 to M214 are connected in parallel between the pad 7 and the N-channel MOS transistor M10 and receive the outputs of the AND circuits AD1 to AD4 at their gates, respectively.

The switching element 220 includes N-channel MOS transistors M221 to M224. The N-channel MOS transistors M221 to M224 are connected in parallel between the pad 6 and the N-channel MOS transistor M10 and receive the outputs of the AND circuits AD11 to AD14 at their gates, respectively.

The N-channel MOS transistor M10 is connected between the sources of the N-channel MOS transistors M211 to M214, M221 to M224 and the ground node receiving the ground voltage. The N-channel MOS transistor M10 receives the bias potential Vref from the reference current circuit 240 and outputs a prescribed constant current. The N-channel MOS transistor M10 has a channel width (W=W0) that is k times the channel width (W=W0/k) of the N-channel MOS transistor M254 in the reference current circuit 240 (the N-channel MOS transistors M10, M254 have the same channel length). Accordingly, the N-channel MOS transistor M10 outputs a current (Iref×k) that is k times the reference current Iref.

The above driver circuit is characterized in that a plurality of N-channel MOS transistors (in this example, four N-channel MOS transistors) are provided in parallel in each switching element 210, 220 and the on-state resistance of the switching elements 210, 220 is varied by changing the number of N-channel MOS transistors to be activated. In the first embodiment, the on-state resistance of the N-channel MOS transistors M1, M2 is varied by the substrate bias effect. However, since the LSI normally has a common substrate, it is difficult to vary the substrate bias. Moreover, it is difficult to vary a wide range of the on-state resistance by the substrate bias effect. For these reasons, in the second embodiment, the on-state resistance is varied by changing the number of N-channel MOS transistors to be activated. This is advantageous in terms of design because an extremely wide range of the on-state resistance can be varied.

Hereinafter, a method for determining the number of N-channel MOS transistors to be activated will be described.

This driver circuit includes AND circuits AD1 to AD4, AD11 to AD14 for selecting the N-channel MOS transistors M211 to M214, M221 to M224 to which the differential data D, ND from the internal circuitry are applied. The driver circuit controls the AND circuits AD1 to AD4, AD11 to AD14 in order to control the number of N-channel MOS transistors M211 to M214, M221 to M224 to be activated. The number of N-channel MOS transistors M211 to M214, M221 to M224 to be activated is controlled by the AND circuits AD1 to AD4, AD11 to AD14 and the selection circuit 230.

Figure 5:
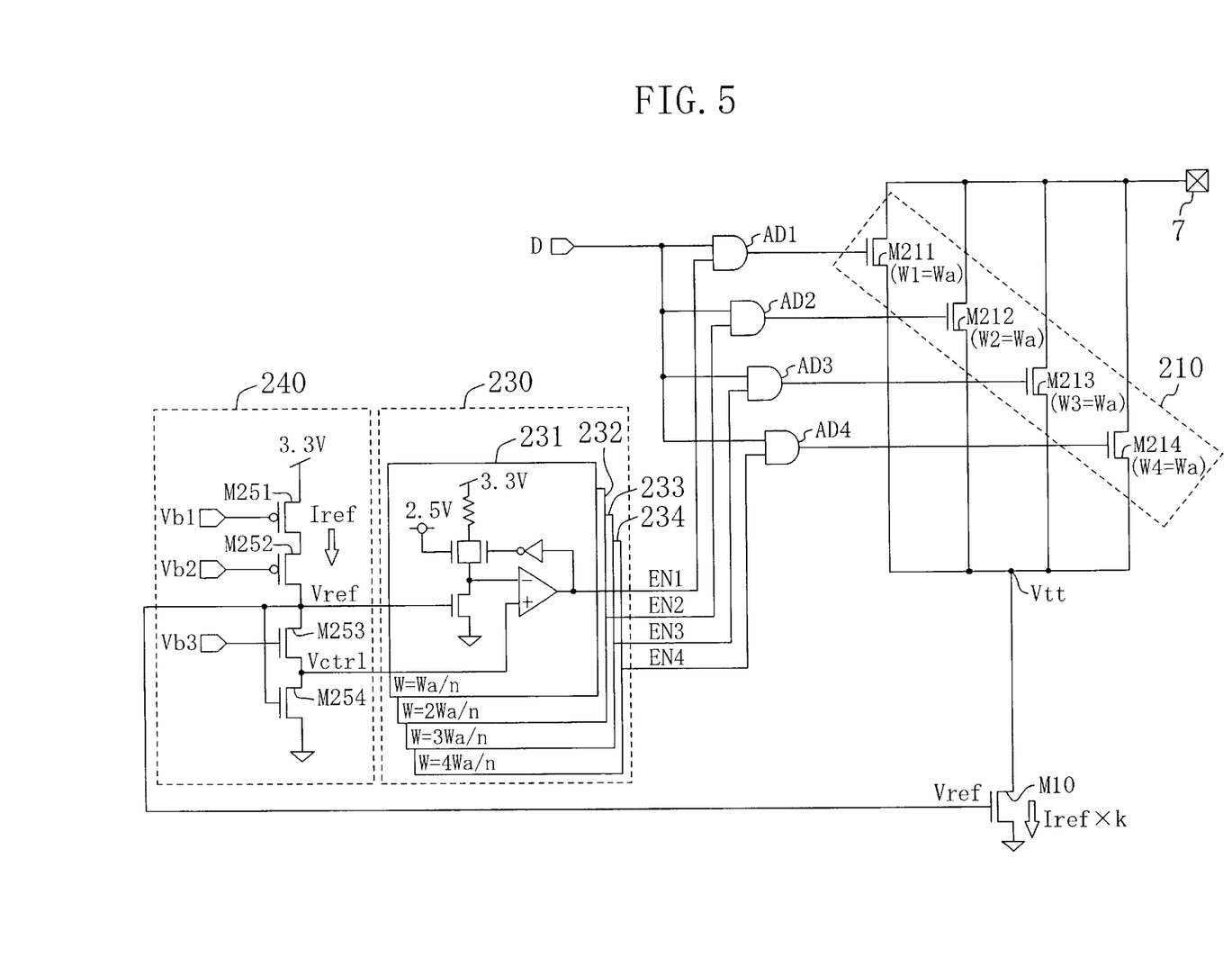
FIG. 5 is a block diagram showing the structure of a selection circuit in FIG. 4.

As shown in FIG. 5, the selection circuit 230 includes four replica circuits 231 to 234 (for simplicity of description, the N-channel MOS transistors M221 to M224 for the data TD are not shown in FIG. 5). The replica circuits 231 to 234 receive the bias potential Vref and the reference potential Vctrl from the reference current circuit 240 and output the enable signals EN1 to EN4, respectively. The replica circuits 231 to 234 correspond to an output section of the driver circuit scaled down to 1/n.

Figure 6:
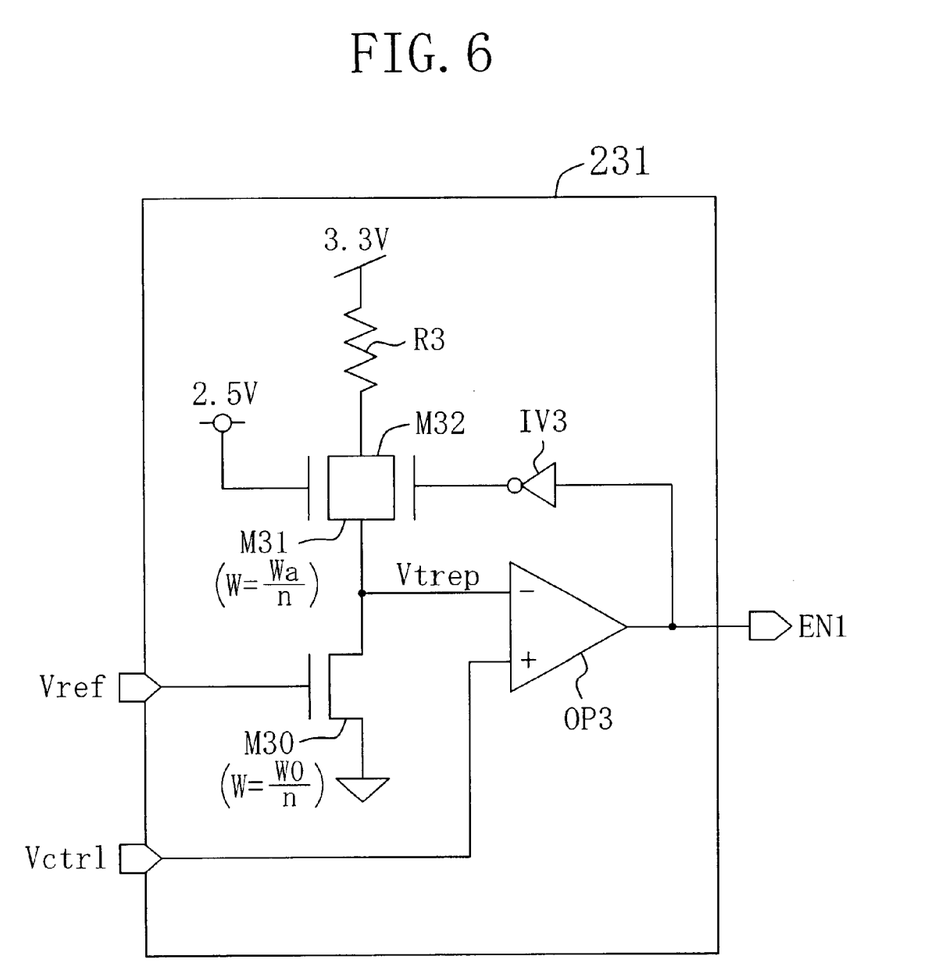
FIG. 6 is a block diagram showing the structure of a replica circuit in FIG. 5.

FIG. 6 is a block diagram showing the internal structure of the replica circuit 231. As shown in FIG. 6, the replica circuit 231 includes N-channel MOS transistors M30 to M32, an operational amplifier OP3, an inverter IV3 and a resistor R3. The resistor R3 has a resistance value that is n times the resistance value Rterm of the resistor 9 (FIG. 3), that is, Rterm×n. The N-channel MOS transistor M30 has the same channel length L as that of the N-channel MOS transistor M10 and has a channel width W (W=W0/n) that is 1/n times the channel width W (=W0) of the N-channel MOS transistor M10. The N-channel MOS transistor M31 has the same channel length L as that of the N-channel MOS transistors M211, M221 and has a channel width W (W=Wa/n) that is 1/n times the channel width (=Wa) of the N-channel MOS transistors M211, M221. Accordingly, the drain potential Vtt of the N-channel MOS transistor M10 which is obtained when only the N-channel MOS transistors M211, M221 are activated in the switching elements 210, 220 appears as a drain potential (replica potential) Vtrep of the N-channel MOS transistor M30.

The operational amplifier OP3 compares the replica potential Vtrep with the reference potential Vctrl. When the replica potential Vtrep is lower than the reference potential Vctrl, the operational amplifier OP3 activates the enable signal EN1 to High (H) level (active). In response to the H-level enable signal EN1, the N-channel MOS transistor M32 is turned OFF by the inverter IV3, whereby the replica potential Vtrep falls. This allows the enable signal EN1 to be stably at H level against noises or the like. In other words, the inverter IV3 and the N-channel MOS transistor M32 generate hysteresis of the comparison of the operational amplifier OP3 in the replica circuit 231.

When the replica potential Vtrep is lower than the reference potential Vctrl, the drain potential Vtt of the N-channel MOS transistor M10 is lower than the reference potential Vctrl even if the N-channel MOS transistors M211, M221 are turned ON. Therefore, the N-channel MOS transistors M211, M221 are activated by the enable signal EN1.

The other replica circuits 232 to 234 have the same structure as that of the replica circuit 231 in FIG. 6 except the channel width of the N-channel MOS transistor M31. The N-channel MOS transistors M31 in the replica circuits 232 to 234 have the following channel width W: W=(W11+W2)/n=2Wa/n; W=(W1+W2+W3)/n=3Wa/n; and W=(W1+W2+W3+W4)/n=4Wa/n, respectively. W1 is a channel width (=Wa) of the N-channel MOS transistors M211, M221, W2 is a channel width (=Wa) of the N-channel MOS transistors M212, M222, W3 is a channel width (=Wa) of the N-channel MOS transistors M213, M223, and W4 is a channel width (=Wa) of the N-channel MOS transistors M214, M224. As a result, the replica potential Vtrep of the replica circuit 232 corresponds to the drain potential Vtt of the N-channel MOS transistor M10 which is obtained when only two N-channel MOS transistors M211, M212, M221, M222 are activated in the switching elements 210, 220. The replica potential Vtrep of the replica circuit 233 corresponds to the drain potential Vtt of the N-channel MOS transistor M10 which is obtained when only three N-channel MOS transistors M211 to M213, M221 to M223 are activated in the switching elements 210, 220. The replica potential Vtrep of the replica circuit 234 corresponds to the drain potential Vtt of the N-channel MOS transistor M10 which is obtained when all N-channel MOS transistors M211 to M214, M221 to M224 are activated in the switching elements 210, 220. The replica potentials Vtrep of the replica circuits 232 to 234 thus correspond to activation of two, three and four N-channel MOS transistors, respectively, and the number of N-channel MOS transistors to be activated is selected so that the replica potential Vtrep becomes slightly higher than the reference potential Vctrl. In this way, the resistance of the N-channel MOS transistors M211 to M214, M221 to M224 in the conductive state (i.e., on-state resistance) is regulated so that the drain potential Vtt of the N-channel MOS transistor M10 gets close to the reference potential Vctrl.

Note that the number of N-channel MOS transistors to be activated is herein selected so that the replica potential Vtrep becomes slightly higher than the reference potential Vctrl. However, the number of N-channel MOS transistors to be activated may alternatively be selected so that the replica potential Vtrep becomes slightly lower than the reference potential Vctrl.

Figure 7:
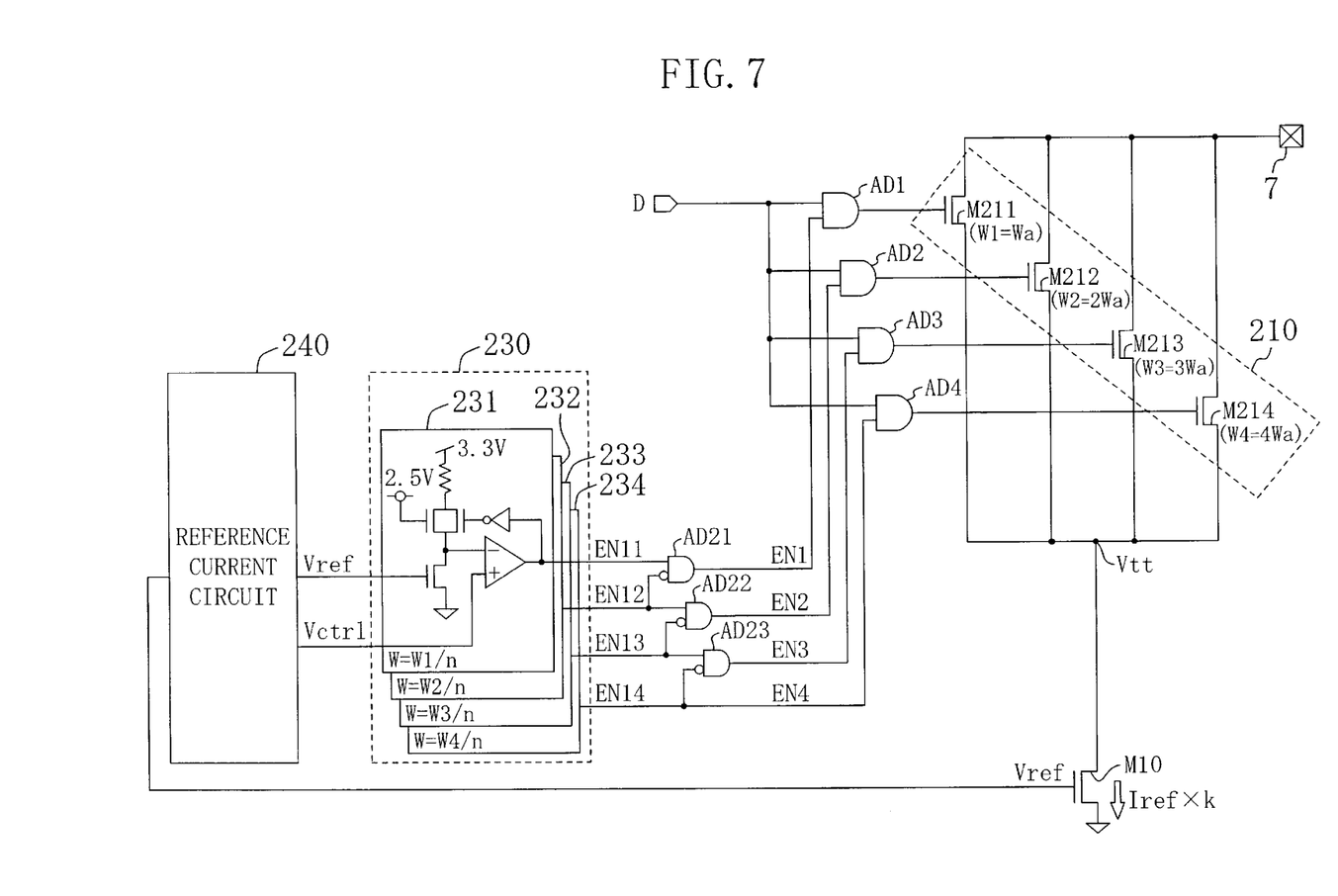
FIG. 7 shows a modification of a driver circuit.

The on-state resistance is herein regulated by varying the number of N-channel MOS transistors M211 to M214, M221 to M224 to be activated. However, the N-channel MOS transistors M211 to M214, M221 to M224 may have different channel widths and the on-state resistance may be regulated by selecting the N-channel transistor to be activated. For example, as shown in FIG. 7, the respective channel widths W1 to W4 of the N-channel MOS transistors M211 to M214 may be Wa, 2Wa, 3Wa and 4Wa. In this case, the respective channel widths of the N-channel MOS transistors M31 in the replica circuits 231 to 234 are W1/n (=Wa/n), W2/n (=2Wa/n), W3/n (=3Wa/n) and W4/n (=4Wa/n). AND circuits AD21 to AD23 are further provided, so that only one of the enable signals EN1 to EN4 is selected.

The reference potential Vctrl is regulated to half the voltage (VDD=2.5 V) applied to the gates of the N-channel MOS transistors M211 to M214, M221 to M224 (that is, 1.25 V) minus a threshold voltage (Vt≈0.5 V) of the N-channel MOS transistors M211 to M214, M221 to M224. That is, the reference potential Vctrl is regulated to 0.75 V Therefore, the N-channel MOS transistors M211 to M214, M221 to M224 are turned ON/OFF at a potential close to an intermediate potential of the amplitude applied to the gates of the N-channel MOS transistors M211 to M214, M221 to M224 (an intermediate potential of the output amplitude of the AND circuits AD1 to AD4, AD11 to AD14). In other words, the N-channel MOS transistors M211 to M214, M221 to M224 are turned ON and turned OFF at the same timing. Therefore, differential output data TD, NTD will cross at the center like the intersection P1 in FIG. 10. As a result, a differential skew of the differential output data is suppressed.

The N-channel MOS transistor M10 and the N-channel MOS transistor M254 of the reference current circuit 240 both have a source-drain potential Vds close to the reference potential Vctrl. This allows a current that is k times the reference current Iref to be accurately mirrored while suppressing the channel modulation effect. As a result, the output current (Iref×k) and thus the differential output amplitude (Iref×k×Rterm) are improved in accuracy.

Although each switching element 210, 220 herein includes four N-channel MOS transistors, the present invention is not limited to this.

What is claimed is:

1. A driver circuit, comprising:
  a constant current section for outputting a prescribed positive or negative current;
  a first pad capable of being connected to the other end of a first resistor, the first pad having one end connected to a first node receiving a first voltage;
  a second pad capable of being connected to the other end of a second resistor, the second pad having one end connected to the first node;
  a first switching element connected between an output node of the constant current section and the first pad and turned ON/OFF in response to a first signal;
  a second switching element connected between the output node of the constant current section and the second pad and turned ON/OFF in response to a second signal that is complementary to the first signal; and
  a control section for controlling a potential at the output node of the constant current section to a prescribed potential,
  wherein the control section varies an on-state resistance value of the first and second switching elements according to the potential at the output node of the constant current section, and
  the first switching element includes first and second transistors connected in parallel between the output node of the constant current section and the first pad and turned ON/OFF in response to the first signal, the second switching element includes third and fourth transistors connected in parallel between the output node of the constant current section and the second pad and turned ON/OFF in response to the second signal, and the control section activates and inactivates the first to fourth transistors according to the potential at the output node of the constant current section.

2. The driver circuit according to claim 1, wherein the prescribed potential is set to a value close to an intermediate potential of minimum and maximum values of a gate potential of the first or second transistor minus a threshold potential of the first or second transistor.

3. The driver circuit according to claim 1, wherein
  the constant current section includes a fifth transistor connected between the output node of the constant current section and a second node receiving a second voltage, and receiving a first bias at the gate thereof,
  the driver circuit further comprising:
  first and second replica circuits, wherein
    the first replica circuit includes a third resistor, a sixth transistor and a seventh transistor,
    the third resistor is connected between the first node and the sixth transistor and has a resistance value of the first resistor scaled up at a first ratio,
    the sixth transistor is connected between the third resistor and the seventh transistor, receives a second bias at its gate, and has a channel width/length ratio of the first transistor scaled down at the first ratio,
    the seventh transistor is connected between the sixth transistor and the second node, receives the first bias at its gate, and has a channel width/length ratio of the fifth transistor scaled down at the first ratio,
    the second replica circuit includes a fourth resistor, an eighth transistor and a ninth transistor,
    the fourth resistor is connected between the first node and the eighth transistor and has a resistance value of the first resistor scaled up at a second ratio,
    the eighth transistor is connected between the fourth resistor and the ninth transistor, receives a third bias at its gate, and has either a channel width/length ratio of the second transistor scaled down at the second ratio or a sum of channel width/length ratios of the first and second transistors scaled down at the second ratio,
    the ninth transistor is connected between the eighth resistor and the second node, receives the first bias at its gate, and has a channel width/length ratio of the fifth transistor scaled down at the second ratio, and
    the control section activates and inactivates the first to fourth transistors based on a drain potential of the seventh transistor in the first replica circuit and a drain potential of the ninth transistor in the second replica circuit.

4. The driver circuit according to claim 3, further comprising:
  a reference current circuit, wherein
    the reference current circuit includes
      a tenth transistor connected between the first node and the second node and receives a fourth bias at its gate, and an eleventh transistor connected in series with the tenth transistor between the tenth transistor and the second node and receives a bias applied to the gate of the fifth transistor at its gate, and the control section activates and inactivates the first to fourth transistors based on a comparison result between the drain potential of the seventh transistor in the first replica circuit and a drain potential of the eleventh transistor in the reference current circuit and a comparison result between the drain potential of the ninth transistor in the second replica circuit and the drain potential of the eleventh transistor in the reference current circuit.

5. The driver circuit according to claim 1, wherein a potential applied to the gates of the first to fourth transistors is lower than the first voltage.

6. A driver circuit, comprising:

a constant current section for outputting a prescribed positive or negative current;

a first pad;

a second pad;

a first switching element connected between an output node of the constant current section and the first pad and turned ON/OFF in response to a first signal;

a second switching element connected between the output node of the constant current section and the second pad and turned ON/OFF in response to a second signal complementary to the first signal;

a first resistor connected between a first node receiving a first voltage and the first pad;

a second resistor connected between the first node and the second pad; and a control section for controlling a potential at the output node of the constant current section to a prescribed potential, wherein the control section varies an on-state resistance value of the first and second switching elements according to the potential at the output node of the constant current section, and wherein the first switching element includes first and second transistors connected in parallel between the output node of the constant current section and the first pad and turned ON/OFF in response to the first signal, the second switching element includes third and fourth transistors connected in parallel between the output node of the constant current section and the second pad and turned ON/OFF in response to the second signal, and the control section activates and inactivates the first to fourth transistors according to the potential at the output node of the constant current section.

7. The driver circuit according to claim 6, wherein the prescribed potential is set to a value close to an intermediate potential of minimum and maximum values of a gate potential of the first or second transistor minus a threshold potential of the first or second transistor.

8. The driver circuit according to claim 6, wherein the constant current section includes a fifth transistor connected between the output node of the constant current section and a second node receiving a second voltage, and receiving a first bias at its gate, the driver circuit further comprising:

first and second replica circuits, wherein the first replica circuit includes a third resistor, a sixth transistor and a seventh transistor, the third resistor is connected between the first node and the sixth transistor and has a resistance value of the first resistor scaled up at a first ratio, the sixth transistor is connected between the third resistor and the seventh transistor, receives a second bias at its gate, and has a channel width/length ratio of the first transistor scaled down at the first ratio, the seventh transistor is connected between the sixth transistor and the second node, receives the first bias at its gate, and has a channel width/length ratio of the fifth transistor scaled down at the first ratio, the second replica circuit includes a fourth resistor, an eighth transistor and a ninth transistor, the fourth resistor is connected between the first node and the eighth transistor and has a resistance value of the first resistor scaled up at a second ratio, the eighth transistor is connected between the fourth resistor and the ninth transistor, receives a third bias at its gate, and has either a channel width/length ratio of the second transistor scaled down at the second ratio or a sum of channel width/length ratios of the first and second transistors scaled down at the second ratio, the ninth transistor is connected between the eighth resistor and the second node, receives the first bias at its gate, and has a channel width/length ratio of the fifth transistor scaled down at the second ratio, and the control section activates and inactivates the first to fourth transistors based on a drain potential of the seventh transistor in the first replica circuit and a drain potential of the ninth transistor in the second replica circuit.

9. The driver circuit according to claim 8, further comprising:

a reference current circuit, wherein the reference current circuit includes a tenth transistor connected between the first node and the second node and receives a fourth bias at its gate, and an eleventh transistor connected in series with the tenth transistor between the tenth transistor and the second node and receives a bias applied to the gate of the fifth transistor at its gate, and the control section activates and inactivates the first to fourth transistors based on a comparison result between the drain potential of the seventh transistor in the first replica circuit and a drain potential of the eleventh transistor in the reference current circuit and a comparison result between the drain potential of the ninth transistor in the second replica circuit and the drain potential of the eleventh transistor in the reference current circuit.

10. The driver circuit according to claim 6, wherein a potential applied to the gates of the first to fourth transistors is lower than the first voltage.

* * * * *